United States Patent [19]

Ashby

[11] Patent Number: 5,451,542
[45] Date of Patent: Sep. 19, 1995

[54] SURFACE PASSIVATION PROCESS OF COMPOUND SEMICONDUCTOR MATERIAL USING UV PHOTOSULFIDATION

[75] Inventor: Carol I. H. Ashby, Edgewood, N. Mex.

[73] Assignee: Sandia Corporation, Albuquerque, N. Mex.

[21] Appl. No.: 263,107

[22] Filed: Jun. 21, 1994

[51] Int. Cl.⁶ .............................................. H01L 21/26
[52] U.S. Cl. ...................................... 437/173; 437/946
[58] Field of Search ................................ 437/173, 946

[56] References Cited

U.S. PATENT DOCUMENTS

| | | | |
|---|---|---|---|
| 4,273,594 | 6/1981 | Heller et al. | 437/946 |
| 4,685,976 | 8/1987 | Schachmeyer et al. | 437/173 |
| 4,877,757 | 10/1989 | York et al. | 437/946 |

OTHER PUBLICATIONS

Yablonovitch, et al., Nearly Ideal Electronic Properties of Sulfide Coated GaAs Surfaces; Appl. Phys. Lett. 51(6), 10 Aug. 1987, pp. 439–441.

Tiedje, et al., Ultraviolet Photoemission Studies of GaAs (100) Surfaces Chemically Stabilized by $H_2S$ Treatments; J. Vac. Sci. Technol. B7(4), Jul./Aug. 1989, pp. 837–840.

Wang, Surface Passivation of GaAs with $P_2S_5$-Containing Solutions; J. Appl. Phys. 71 (6), 15 Mar. 1992, pp. 2746–2756.

"Ultraviolet Photosulfidation of III–V Compound Semiconductors for Electronic Passivation", K. R. Zavadil, et al., American Vacuum Society—40th National Symposium—Nov. 15–19, 1993.

"Ultraviolet Photosulfidation of III–V Compound Semiconductors: A New Approach to Surface Passivation", C. I. H. Ashby, et al., Appl. Phys. Lett. 64(18), 2 May 1994, pp. 2388–2390.

Primary Examiner—George Fourson
Assistant Examiner—Thomas G. Bilodeau
Attorney, Agent, or Firm—Gregory A. Cone

[57] ABSTRACT

A method for passivating compound semiconductor surfaces by photolytically disrupting molecular sulfur vapor with ultraviolet radiation to form reactive sulfur which then reacts with and passivates the surface of compound semiconductors.

12 Claims, 1 Drawing Sheet

SURFACE PASSIVATION PROCESS OF COMPOUND SEMICONDUCTOR MATERIAL USING UV PHOTOSULFIDATION

BACKGROUND OF THE INVENTION

This invention relates to surface passivation methods for compound semiconductor microelectronic and optoelectronic materials. More particularly, it relates to the use of sulfur as the passivating substance which combines with the surface with the assistance of UV photolysis.

This photosulfidation process differs from existing technology in a very fundamental way. It is the first passivation process using elemental sulfur vapor combined with chemical activation of sulfur by photoexcitation using UV light to generate highly reactive S-species. This use of photon absorption and molecular excitation to generate reactive sulfur species has not previously been employed for passivation of compound semiconductor surfaces. There have been a number of previous passivation processes based on sulfur compounds, but none have employed photoactivation. These earlier processes include wet dips/spins of solutions of various sulfides such as $Na_2S$, $(NH_4)_2S$, $(NH_4)_2S_x$, and $P_2S_5/(NH_4)_2S$, treatment with organic thiols, treatment with hydrogen sulfide plasmas, and spin-casting of solutions of $As_xS_y$. After consideration of the effects of semiconductor doping level and photoluminescence (PL) excitation wavelength, all these earlier treatments and this photosulfidation process produce the same order of magnitude change in PL intensity, indicating comparable efficacy as passivation processes. When properly handled, the present process can produce PL results ~50%–75% better than the earlier treatments. This relative equivalence is not unexpected, since in all cases semiconductor-sulfur bonding is responsible for the improved electronic properties. Consequently, the following comparison of processes will emphasize the numerous advantages of our photosulfidation process in areas other than passivation.

There are some general advantages of this photosulfidation process over alternative S-based passivation processes. These include such features as negligible generation of hazardous waste, low toxicity of the chemicals involved, the convenience of transient exposure to UV light and a low pressure vapor, the inexpensive equipment requirements (a high vacuum reaction chamber and a UV light source such as a high-pressure Hg lamp), the low probability of process-induced damage to semiconductor, and flexibility regarding the point in the device fabrication process at which passivation can be performed, i.e., it can be done after metallization as a final process step before encapsulation. In addition, it can be readily incorporated as a step in vacuum integrated processing.

SUMMARY OF THE INVENTION

This new process is based on the generation of highly reactive sulfur species by photolysis of molecular sulfur vapor using ultraviolet (UV) light. The resulting highly reactive sulfur species then react with a compound semiconductor surface. This reaction changes the electronic properties of the semiconductor; some possible changes include lower surface state density, lower surface recombination velocity, altered space charge depths, etc. The net effect of such changes is an improvement in device performance that is dependent on surface or interface electronic properties.

A wide range of microelectronic and optoelectronic devices can be improved by the electronic passivation provided by our process. These include electronic devices such as heterojunction bipolar transistors (HBTs), nonvolatile memories, and solar cells. For example, HBTs can benefit from passivation to achieve gain at low currents for reduced power consumption and by improved gain at higher currents for improved performance. Nonvolatile memory devices in compound semiconductor materials currently are not a marketable technology due, in large part, to carrier losses through surface recombination. This process can also be used to lower trap densities to improve Schottky contact performance, which will improve MESFET performance. If the passivation process unpins the Fermi level, MIS devices will be possible. Optoelectronic devices that can be improved include edge-emitting lasers, vertical cavity lasers, ring diode lasers, photonic circuit components such as waveguide photodetectors, optical amplifiers, and many other types of photonic and electronic devices with exposed edges.

BRIEF DESCRIPTION OF THE DRAWING

The drawing FIGURE is a bar chart showing the photoluminescence response in arbitrary units, normalized to a non-sulfur-passivated surface, of a variety of different sulfur passivation surface treatments.

DETAILED DESCRIPTION OF THE INVENTION

Figure 1:
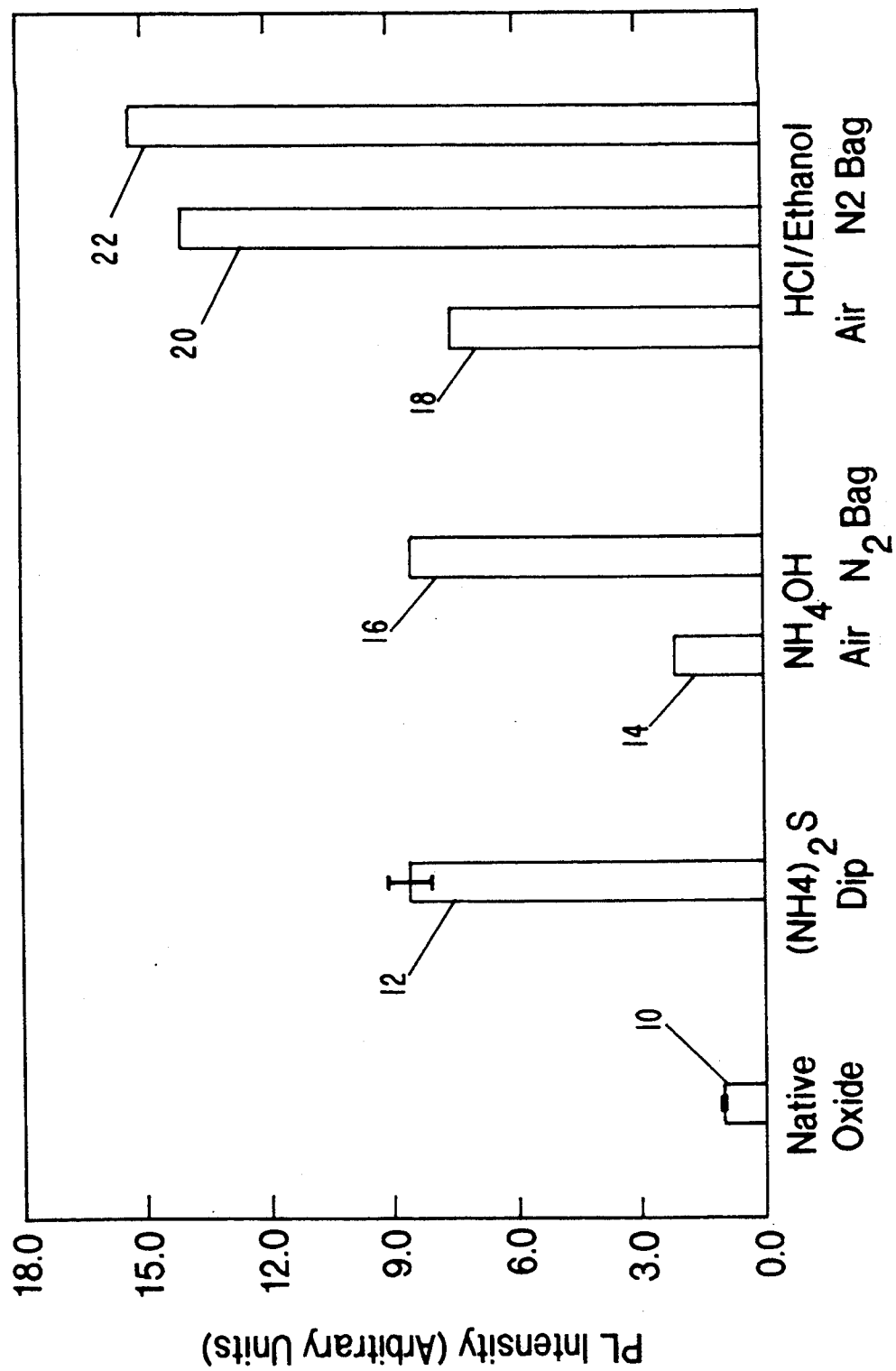

The first step in the photosulfidation process is the removal or reduction of oxides on the compound semiconductor surface. There are several methods for achieving this oxide removal, as would be known to someone skilled in the art. These methods include, but are not restricted to, aqueous oxide removal techniques, such as treatment with $NH_4OH$-based solutions, lactic acid-based solutions, or HCl-based solutions followed by a rinse or not; thermal desorption of the oxides; hydrogen plasma oxide removal; etc. The preferred method of oxide removal will depend on the semiconductor compound and device structure that is to be passivated, and would be readily selected by one skilled in the art.

Active sulfur species that can react with and passivate the compound semiconductor surface are generated by absorption of UV light by molecular sulfur, which normally exists in the vapor phase at low temperature as $S_8$ rings. These highly reactive sulfur species, including such species as $S_8$ (chain), $S_6$, and other sulfur radicals, then react with the compound semiconductor surface in such a fashion as to alter the surface electronic properties of the semiconductor in a desired way. It is also possible that the generation of the reactive sulfur species occurs at the surface of the semiconductor rather than above it. The data are inconclusive on this point.

One embodiment of this process projects UV light with wavelengths less than or equal to 400 nm onto the compound semiconductor surface. While the surface is illuminated with UV light, sulfur vapor is introduced into the reaction chamber at pressures less than one atmosphere. The desired pressure of sulfur is provided by heating a crucible containing solid sulfur to the temperature that will provide the desired vapor pressure. In one embodiment, the pressure employed is between $10^{-7}$ and $10^{-3}$ Torr and the semiconductor is at room temperature. Sulfur impinging or adsorbed on the surface is converted from less reactive $S_8$ rings to more reactive S-containing species by photolysis (1). This photolytic activation of sulfur can occur on the surface following adsorption or in the gas phase before adsorption. It is desirable to initiate photolysis before a thick layer of unphotolyzed $S_8$ (ring) deposits on the compound semiconductor surface, thereby preventing reaction between the surface and the photoactivated sulfur. This is most readily achieved by directing UV light onto the surface before the introduction of appreciable $S_8$ (ring) flux and by using a photon flux significantly in excess of the $S_8$ (ring) flux to the surface to insure that the probability for photolysis prior to being covered up by subsequent $S_8$ (ring) deposition is high. The photon flux-to-$S_8$ flux ratio is normally 1:1 or greater.

A commonly employed measure of the passivating ability of a process for semiconductors is the increase in photoluminescence (PL) intensity, which correlates with such electronic properties as reduced surface state density, decreased depletion layer thickness, and lower nonradiative surface recombination rates. All of these changes in electronic properties can contribute to superior device performance. The effect of this photosulfidation process on the PL intensities of several n-type GaAs materials of different doping levels has been examined. All have shown significant improvement in PL intensity due to photosulfidation. For example, increases in PL intensity of up to nine-fold have been measured with $5 \times 10^{16}/cm^3$ n-GaAs (epitaxially grown by molecular beam epitaxy), indicating substantial improvement in surface electronic properties, and even better results with both n-GaAs and p-GaAs are reported below. GaAs has been employed in these PL studies because of the convenient wavelength of its PL emission. However, this process is applicable to the entire family of III-V semiconductor materials, regardless of band-gap emission energy, and possibly to II-VI and II-IV materials as well, with the true scope of this invention being described in the claims found below.

One very important improvement of this photosulfication process over prior processes is its use of elemental sulfur, which is a much less hazardous material than the chemicals used in previously developed S-based passivation processes. Specific comparisons of toxicity and other environmental hazards are discussed for each competing process below.

This photosulfidation process is a dry (gas-phase reactant) process. There are many advantages of dry processes over wet processes, as are well known to those skilled in the art of semiconductor device fabrication. These include such factors as ease of reactant handling and post-process waste handling and the possibility of vacuum integrated processing. The competing dry process for S-based passivation employs thermal or plasma activation of hydrogen sulfide. Hydrogen sulfide is an extremely toxic gas (human LCLo=800 ppm/5 min, rat LC50-444 ppm, which are lower than the values for hydrogen cyanide). Use of such toxic gases requires expensive gas handling equipment, both for reactant introduction and for post-process waste-stream scrubbing, and leak detection equipment for safe usage. In contrast, the inhalation toxicity of sulfur vapor is sufficiently low that LCLo or LC50 data are not even included in the sulfur MSDS. No toxic byproducts of the passivation process are expected, either. Additionally, the sulfur is loaded into the vaporization crucible as a solid, which makes for great ease of handling. An additional problem with plasma-based processes is the presence of energetic particles that can damage the semiconductor material in ways that degrade the very same electronic properties that one wants to improve by passivation. Since the photosulfidation process used photons rather than energetic particles to generate highly reactive S-species, there will be no comparable process-induced damage. It is also well known that hydrogen-containing plasmas can passivate donors and/or acceptors, thereby requiring high-temperature treatment for carrier reactivation. This photosulfidation process does not employ atomic hydrogen sources and will not, therefore, require thermal treatments following passivation.

The principal competing wet technologies employ solutions of various sulfide compounds or of organic thiols. Such solutions are invariably accompanied by unpleasant and potentially toxic vaporization of sulfur-containing compounds. For example, acidification of sulfide solutions will release extremely toxic hydrogen sulfide vapor. Hydrogen sulfide may also accumulate in the head space of containers or in enclosed areas where the sulfide products are stored, handled or used. It is also necessary to handle aqueous or organic solvent wastes containing sulfides, possibly including hydrogen sulfide. Additionally, the advantages of dry vs. wet processing are well known to those skilled in the art of microelectronic processing.

Processes based on spin-casting $As_xS_y$ glasses employ a toxic and potentially carcinogenic material and would require use in designated areas following carcinogenic/highly toxic chemical handling protocols. This is in strong contrast with our process, which uses only relatively nontoxic materials.

Sulfur passivation studies were conducted with n-GaAs ($6.9 \times 10^{16}/cm^3$) and p-GaAs ($1.1 \times 10^{17}/cm^3$) grown by molecular beam epitaxy (MBE) on a substrate of (100)n+-GaAs ($1.85 \times 10^{18}/cm^3$). Substrate material was used for completing the survey of suitable methods of native oxide removal from the GaAs surface. Failure to remove the native oxide effectively precludes any photosulfidation. Two common etchant solutions, 1:20 $NH_4OH/H_2O/$ and 1:10 HCl/ethanol, were used for oxide removal. The GaAs surface was flushed with the etchant for 30 seconds and, in the case of the HCl/ethanol etchant, rinsed in ethanol. Electronic grade reagents were used to prepare the etchant solutions. Because the prototype sulfur deposition chamber was not designed for in-situ oxide removal, the degree to which the surface is oxide free, and hence the subsequent degree of photosulfide passivation, is strongly dependent on sample handling between removal from the oxide etchant solutions and sulfur exposure in-vacuo. Our original cleaning studies were conducted in the ambient atmosphere under copious $N_2$-gas flow to blow-dry the substrate after etching/rinsing and to provide a relatively inert gas curtain for vacuum loading. Excessive oxygen exposure during such handling has led us more recently to use $N_2$-purged glove bags attached to our photodeposition and analysis chambers for cleaning and loading processes. While cleaning in $N_2$ atmosphere has improved the extent of sulfidation, photosulfidation can be expected to provide the greatest improvement in electronic properties when applied to an oxygen-free surface in a vacuum integrated mode.

The photodeposition chamber is a standard high vacuum cross equipped with a $MgF_2$ viewport, low current/thermocouple feedthrough, a custom sample mount and appropriate valving for turbomolecular pumping, isolation and inert gas backfilling. The sulfur source consists of a glass crucible containing precipitated sulfur powder (>99.5%). The sulfur temperature and vapor pressure can be controlled by resistively heating a wire element wrapped about the crucible. The source temperature is monitored with a thermocouple attached to the crucible with a thermally conductive ceramic adhesive. Typical source temperatures during deposition are 46°–48°, which yields a sulfur partial pressure of $3 \times 10^{-5}$ Torr. Photodissociation of the $S_8$ allotrope to produce highly reactive sulfur radicals is accomplished by irradiation with UV light ($\lambda < 320$ nm). A high pressure Hg arc lamp was used as a UV photon source. We estimate a photon flux for $\lambda < 320$ nm to be $2-4 \times 10^{15}$ photons/cm$^2$-s. Under deposition conditions, we estimate a photon-to-$S_8$ flux ratio of 2:1 at the GaAs surface.

Exposure to $10^{-5}$ Torr sulfur before UV illumination results in no improvement in PL; this suggests that no appreciable reaction occurs between the GaAs surface and the photoactivated sulfur if there is significant molecular sulfur exposure before illumination. We attribute this lack of reaction to condensation of a sufficient thickness of molecular sulfur on the surface to exclude access of photodissociated reactive sulfur species to the GaAs. Photolytic formation of highly reactive sulfur species may occur in the gas phase or during adsorption on the GaAs surface; our experiments to date do not exclude either possibility.

The intensity of the room temperature GaAs PL signal at a fixed wavelength of 872-nm with a spectrometer band pass of 8 nm was used to assess the effectiveness of photosulfidation as a surface passivant. Most S-based passivations are unstable in the presence of oxygen; this instability is increased in the presence of light. Consequently, a $N_2$ gas curtain was maintained across the sample surface to minimize oxygen exposure during PL measurements. The PL excitation intensity at 488 nm was held constant at less than 3.6 W/cm$^2$ for all PL reported here. The PL intensity was measured at 9.25 second intervals with a lock-in time constant of 3 sec. Although these conditions result in moderate signal to noise, they minimize photo-induced loss of passivation due to the PL-excitation beam. The variation in the values for PL intensity from native oxide surfaces is less than 0.05 arbitrary units as displayed in the drawing FIGURE; we assume a similar measurement uncertainty for sulfided surfaces. The PL intensity from samples immersed in aqueous $(NH_4)_2S$ for 15 min at 21° C., a common wet sulfide process, was also measured for comparison of the conventional wet process with photosulfidation. In the FIGURE, bar 10 represents the normalized intensity PL intensity response for the native oxide surface with a value of 1 and bar 12 is the response after dipping in $(NH_4)_2S$, with neither including the photosulfidization step of this invention. The remaining bars in the FIGURE show the PL response after photosulfidization with bar 14 using an $NH_4OH$ oxide removal solution done in air, with bar 16 using an $NH_4OH$ oxide removal done in an $N_2$ bag, with bar 18 using HCl/ethanol oxide removal in air, with bar 20 using HCl/ethanol oxide removal in an $N_2$ bag, and with bar 22 using HCl/ethanol cleaning in the $N_2$ bag with an additional stream of $N_2$ being directed on the sample at all times. The importance of careful oxygen exclusion is apparent.

I claim:

1. A method of passivating a surface of a compound semiconductor comprising:
   irradiating the surface in a chamber having less than 1 atmosphere pressure with ultraviolet (UV) radiation, and
   introducing molecular sulfur vapor into the chamber in the vicinity of the surface such that the UV radiation is absorbed by the molecular sulfur vapor, which then changes into reactive sulfur species, which then react with the surface.

2. The method of claim 1 wherein oxides are present on the surface and have been at least partially removed prior to the passivation.

3. The method of claim 1 wherein the molecular sulfur vapor is produced by heating solid sulfur.

4. The method of claim 1 wherein the UV radiation has a wavelength of less than about 400 nm.

5. The method of claim 1 wherein the UV photon flux onto the surface exceeds the flux of $S_8$ rings onto the surface.

6. The method of claim 5 wherein the UV photon flux is at least two times greater than the $S_8$ ring flux.

7. The method of claim 1 wherein the chamber pressure is from about $10^{-7}$ to $10^{-3}$ Torr.

8. The method of claim 1 wherein the temperature of the surface is about room temperature.

9. The method of claim 1 wherein the compound semiconductor comprises a III-V compound.

10. The method of claim 9 wherein the III-V compound comprises GaAs.

11. The method of claim 1 wherein the irradiation is begun prior to the introduction of the molecular sulfur vapor into the vicinity of the surface of the compound semiconductor.

12. The method of claim 1 wherein the steps are conducted in a non-oxygen containing environment.

* * * * *

UNITED STATES PATENT AND TRADEMARK OFFICE
CERTIFICATE OF CORRECTION

PATENT NO. : 5,451,542
DATED : Sept. 19, 1995
INVENTOR(S) : Carol I.H. Ashby

It is certified that error appears in the above-indentified patent and that said Letters Patent is hereby corrected as shown below:

Column 1, line 6, insert the following paragraph:

"The Government has rights in this invention pursuant to Contract No. DE-AC04-76DP00789 awarded by the U.S. Department of Energy."

Signed and Sealed this

Third Day of September, 1996

*Attest:*

BRUCE LEHMAN

*Attesting Officer*   Commissioner of Patents and Trademarks